(12) United States Patent
Kim et al.

(10) Patent No.: US 10,897,259 B1
(45) Date of Patent: Jan. 19, 2021

(54) PHASE LOCKED CIRCUIT, METHOD OF OPERATING THE SAME, AND TRANSCEIVER

(71) Applicant: SAMSUNG ELECTRONICS CO., LTD., Suwon-si (KR)

(72) Inventors: Shinwoong Kim, Suwon-si (KR); Myounggyun Kim, Seoul (KR); Chulho Kim, Hwaseong-si (KR); Inhyo Ryu, Hwaseong-si (KR); Jaewon Choi, Suwon-si (KR); Sangwook Han, Seoul (KR); Honggul Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/853,076

(22) Filed: Apr. 20, 2020

(30) Foreign Application Priority Data

Jul. 11, 2019 (KR) .......................... 10-2019-0083948

(51) Int. Cl.

| | |
|---|---|
| *H03L 7/087* | (2006.01) |
| *H03L 7/089* | (2006.01) |
| *H03L 7/095* | (2006.01) |
| *H03L 7/14* | (2006.01) |
| *H03L 7/091* | (2006.01) |
| *H03L 7/099* | (2006.01) |

(Continued)

(52) U.S. Cl.
CPC ............ *H03L 7/0898* (2013.01); *H03L 7/087* (2013.01); *H03L 7/091* (2013.01); *H03L 7/093* (2013.01); *H03L 7/095* (2013.01); *H03L 7/0992* (2013.01); *H03L 7/145* (2013.01); *H03L 7/195* (2013.01)

(58) Field of Classification Search
CPC combination set(s) only.
See application file for complete search history.

(56) References Cited

U.S. PATENT DOCUMENTS

| | | | |
|---|---|---|---|
| 6,960,948 | B2 | 11/2005 | Kizer et al. |
| 7,969,337 | B2 | 6/2011 | Ratnakar Aravind et al. |

(Continued)

OTHER PUBLICATIONS

Wu et al., "A 28-nm 7fsrms Analog Fractional-N Sampling PLL With a Highly Linear DTC Incorporating Background DTC Gain Calibration and Reference Clock Duty Cycle Correction", IEEE Journal of Solid-State Circuits, vol. 54, No. 5, May 5, 2019.

(Continued)

*Primary Examiner* — An T Luu
(74) *Attorney, Agent, or Firm* — F. Chau & Associates, LLC

(57) ABSTRACT

A phase locked circuit includes an oscillator configured to generate an output clock signal, a first phase detector configured to detect a phase difference between an input clock signal and a feedback clock signal based on the output clock signal, a second phase detector having a wider phase locking range than that of the first phase detector and configured to detect the phase difference between the input clock signal and the feedback clock signal, and a charge pump controller configured to control an output current of a charge pump included in the second phase detector based on the phase difference detected by the first phase detector. When the phase difference between the input clock signal and the feedback clock signal is within the phase locking range of the first phase detector, the oscillator and the first phase detector are connected to each other.

20 Claims, 12 Drawing Sheets

(51) Int. Cl.
*H03L 7/195* (2006.01)
*H03L 7/093* (2006.01)

(56) References Cited

U.S. PATENT DOCUMENTS

| | | |
|---|---|---|
| 8,120,399 B2 | 2/2012 | Kizer |
| 9,252,786 B2 * | 2/2016 | Ek .................. H04L 7/0331 |
| 9,490,818 B2 | 11/2016 | Perrott |
| 9,548,746 B2 | 1/2017 | Wicpalek et al. |
| 9,577,650 B2 * | 2/2017 | Buch ................. H03L 7/087 |
| 9,838,024 B2 | 12/2017 | Chen et al. |
| 10,158,366 B2 | 12/2018 | Galton et al. |
| 10,277,387 B2 * | 4/2019 | Tsunoda .............. H04L 7/0331 |
| 2002/0176188 A1 | 11/2002 | Ruegg et al. |

OTHER PUBLICATIONS

Lin et al., "Dynamic Current-Matching Charge Pump and Gated-Offset Linearization Technique for Delta-Signma Fractional-N PLLs", IEEE Transactions on Circuits and Systems—I: Regular Papers, vol. 56, No. 5, May 2009
Liao et al., "A 2.4-GHz 16-Phase Sub-Sampling Fractional-N PLL With Robust Soft Loop Switching", IEEE Journal of Solid-State Circuits, vol. 53, No. 3, Mar. 2018.

\* cited by examiner

PHASE LOCKED CIRCUIT, METHOD OF OPERATING THE SAME, AND TRANSCEIVER

CROSS-REFERENCE TO RELATED APPLICATION

This U.S. non-provisional patent application claims the benefit of under 35 U.S.C. § 119 to Korean Patent Application No. 10-2019-0083948, filed on Jul. 11, 2019, in the Korean Intellectual Property Office, the disclosure of which is incorporated by reference in its entirety herein.

BACKGROUND

1. Technical Field

The inventive concept relates to a phase locked circuit, and more particularly, to a phase locked circuit including a fine phase detection circuit and a coarse phase detection circuit.

2. Discussion of Related Art

A phase locked circuit (a phase locked loop (PLL)) is a control system that generates an output signal whose phase is related to the phase of a reference signal. The phase locked circuit may synchronize and fix the phase of the reference signal with the phase of the output signal. The phase locked circuit may include a phase detection circuit used for synchronizing and fixing a phase difference between the reference signal and the output signal. The phase detection circuit may include a phase difference detector having a high gain. However, a locking range may be narrow in the phase detection circuit. That is, when the phase difference between the reference signal and the output signal is greater than the locking range, the phase detection circuit may operate abnormally.

SUMMARY

At least one embodiment of the inventive concept provides a phase locked circuit for switching a circuit connected to an oscillator (for example, a voltage control oscillator) from a coarse phase detection circuit to a fine phase detection circuit by using a detection result of the fine phase detection circuit and a method of operating the same.

According to an exemplary embodiment of the inventive concept, there is provided a phase locked circuit including an oscillator configured to generate an output clock signal, a first phase detector configured to detect a phase difference between an input clock signal and a feedback clock signal based on the output clock signal, a second phase detector having a wider phase locking range than that of the first phase detector and configured to detect the phase difference between the input clock signal and the feedback clock signal, and a charge pump controller configured to control an output current of a charge pump included in the second phase detector based on the phase difference detected by the first phase detector. When the phase difference between the input clock signal and the feedback clock signal is within the phase locking range of the first phase detector, the oscillator and the first phase detector are connected to each other.

According to an exemplary embodiment of the inventive concept, there is provided a phase locked circuit including an oscillator configured to generate an output clock signal, a first phase difference detector configured to output a first voltage that indicates a phase difference between an input clock signal and a feedback clock signal, a phase lock detector configured to detect whether a level of the first voltage is included in a previously set voltage level period to output a first detection signal, a charge pump controller configured to output a charge pump control signal that controls an amount of output current of the charge pump based on the first detection signal, and a second phase difference detector configured to output a second detection signal that indicates the phase difference between the input clock signal and the feedback clock signal. The charge pump is configured to output the output current based on the second detection signal and the charge pump control signal. A frequency of the output clock signal is based on the amount of the output current, and the feedback clock signal is based on the output clock signal.

According to an exemplary embodiment of the inventive concept, there is provided a method of operating a phase locked circuit, including detecting, by a first phase difference detector, a phase difference between an input clock signal and a feedback clock signal by a first phase difference detector, outputting a logic high upper limit detection signal when the phase difference indicates a phase of the feedback clock signal is later than a target phase and outputting a logic high lower limit detection signal when the phase difference indicates the phase of the feedback clock signal is earlier than the target phase, controlling an output current of a charge pump connected to a second phase difference detector based on the lower limit detection signal and the upper limit detection signal, and controlling a frequency of an output clock signal based on the output current.

According to an exemplary of the inventive concept, there is provided a transceiver including a phase locked circuit. The phase locked circuit includes a first phase difference detector of a first type configured to detect a phase difference between an input clock signal and a feedback clock signal, a second phase difference detector of a second type configured to detect the phase difference between the input clock signal and the feedback clock signal, a charge pump controller configured to control an amount of output current of a charge pump, an oscillator configured to output an output clock signal and to control a frequency of the output clock signal based on the output current, a switch configured to establish an electrical connection between the oscillator and one of the first phase difference detector and the second phase difference detector based on an output voltage of the first phase difference detector, a transmitter configured to receive a transmission input signal from a signal processor, to perform first frequency mixing on a signal based on the transmission input signal and the output clock signal, and to output a transmission output signal through an antenna, and a receiver configured to receive a reception input signal through the antenna, to perform second frequency mixing on a signal based on the reception input signal and the output clock signal, and to output a reception output signal to the signal processor.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EXEMPLARY EMBODIMENTS

Hereinafter, embodiments of the inventive concept will be described in detail with reference to the accompanying drawings.

Figure 1:
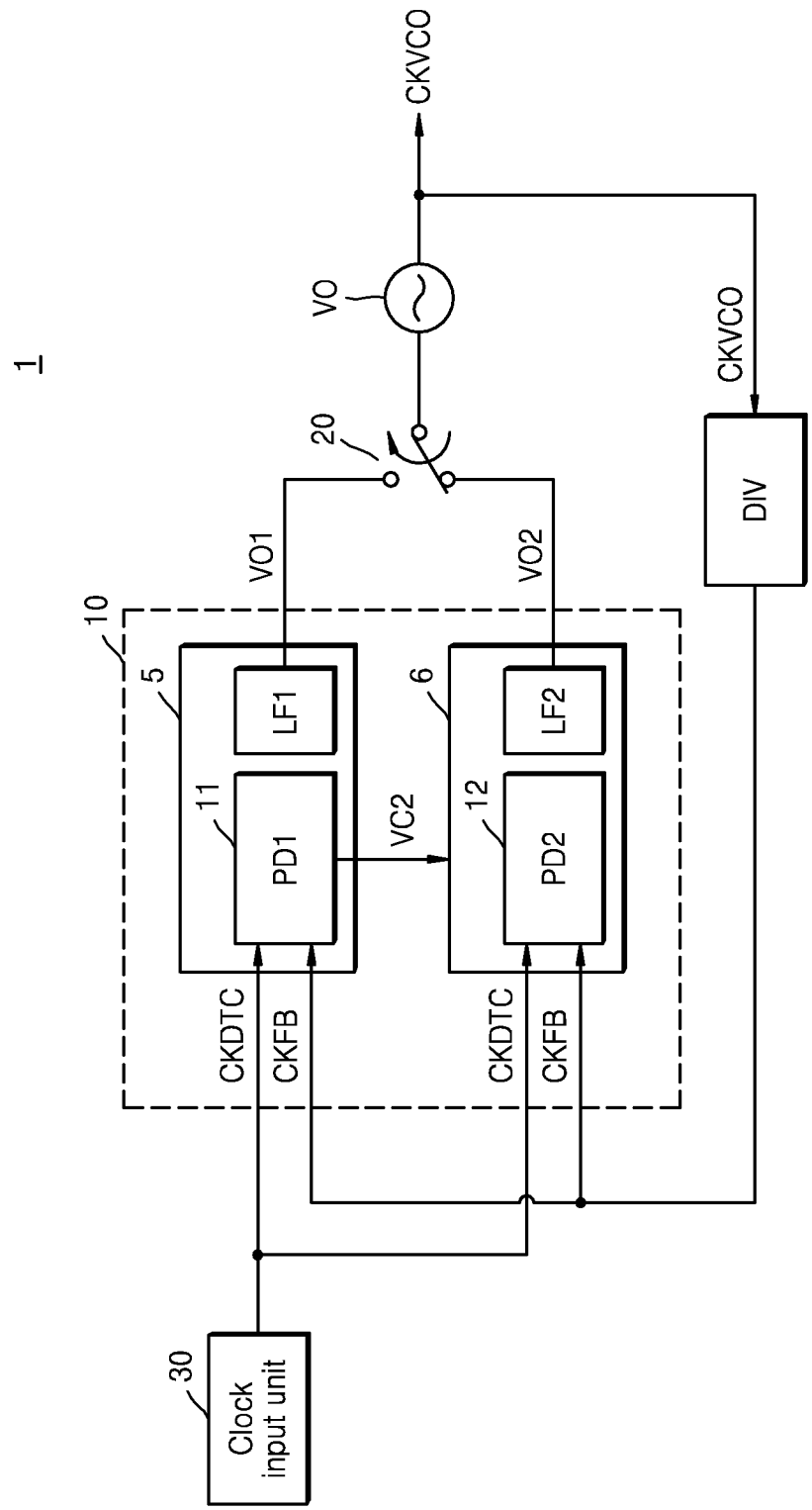
FIG. 1 is a block diagram illustrating a phase locked circuit according to an exemplary embodiment of the inventive concept.

FIG. 1 is a block diagram illustrating a phase locked circuit 1 according to an exemplary embodiment of the inventive concept.

A phase locked loop (PLL) may include a phase detector (e.g., a phase detection circuit), a charge pump, a loop filter, voltage control oscillator, and a divider (e.g., a voltage dividing circuit). The phase detector is for receiving a reference signal and a feedback signal and detecting a phase difference the reference signal and the feedback signal. The charge pump is for receiving a detection signal from the phase detector and outputting a current corresponding to the received detection signal. The loop filter is for outputting a voltage to be applied to a voltage control oscillator based on the current output from the charge pump. The voltage control oscillator is for outputting an output signal. The divider is for dividing the output signal by an integer or a fraction and outputting the feedback signal to the phase detector.

The PLL may be implemented by an analog or digital circuit and may be referred to as a phase locked circuit. Components described below such as a unit, a detector, a divider, a converter, an oscillator, or a switch may be implemented by hardware (e.g., a circuit) according to an exemplary embodiment of the inventive concept. However, the inventive concept is not limited thereto. The components may be implemented by software or a combination of hardware and software in alternate embodiments. For example, the circuit may be implemented by a digital circuit as well as an analog circuit.

Referring to FIG. 1, the phase locked circuit 1 includes a phase detector 10, a switch 20, an oscillator VO, a divider DIV, and a clock input unit 30.

According to an exemplary embodiment of the inventive concept, the phase detector 10 includes a first phase detector 5 and a second phase detector 6. In an exemplary embodiment, the phase detector 10 detects a phase difference between an input clock signal CKDTC and a feedback clock signal CKFB and outputs a first output voltage VO1 and a second output voltage VO2 corresponding to the phase difference. Hereinafter, a phase difference between the input clock signal CKDTC and the feedback clock signal CKFB may be referred to as 'a phase difference' for ease of discussion.

According to an exemplary embodiment of the inventive concept, the first phase detector 5 include a fine phase detection (PD1) circuit 11 and a first loop filter LF1. The second phase detector 6 includes a coarse phase detection circuit 12 and a second loop filter LF2. In an exemplary embodiment, the second phase detector 6 has a wider phase locking range than the first phase detector 5. In an exemplary embodiment, the first phase detector 5 is configured to detect a finer phase difference than the second phase detector 6. Therefore, the phase locked circuit 1 may perform a switching operation when a phase is approximately locked in a wide range. That is, the phase locked circuit 1 may electrically connect the oscillator VO to the second phase detector 6 in response to a control signal (for example, LCK of FIG. 2) received by the switch 20. Hereinafter, the fine phase detection circuit 11 may be referred to as a first phase difference detector and the coarse phase detection circuit 12 may be referred to as a second phase difference detector.

The fine phase detection circuit 11 detects the phase difference between the input clock signal CKDTC and the feedback clock signal CKFB and outputs a first voltage VC2 based on the detected phase difference. For example, the fine phase detection circuit 11 may include a sampling phase detector. In an embodiment, the fine phase detection circuit 11 has a narrower locking range than the coarse phase detection circuit 12. Since the fine phase detection circuit 11 has a higher gain than the coarse phase detection circuit 12, the fine phase detection circuit 11 may detect a fine phase difference. An operation of the fine phase detection circuit 11 detecting the phase difference will be described later in detail with reference to FIG. 5.

A converter GM (see FIG. 3) may convert a detection voltage (e.g., V01) output from the fine phase detection circuit 11 into a current. For example, the converter GM may receive the detection voltage, multiply the received detection voltage by a prescribed gain value to generate an internal voltage, and output a detection current based on the internal voltage. The first loop filter LF1 may receive the detection current and may output the first output voltage VO1 based on the received detection current.

The coarse phase detection circuit 12 detects the phase difference between the input clock signal CKDTC and the feedback clock signal CKFB and outputs a second detection signal (for example, UP and DN of FIG. 3) based on the detected phase difference. A charge pump CP may output an output current based on the received second detection signal. The second loop filter LF2 outputs the second output voltage VO2 based on the output current.

The charge pump CP may output the output current based on the second detection signal (for example, UP and DN of FIG. 3) and may control an amount of output current based on the first voltage VC2. In an embodiment, the coarse phase detection circuit 12 synchronizes the phase difference to a locking range of the fine phase detection circuit 11. The coarse phase detection circuit 12 may monitor the first voltage VC2 output from the fine phase detection circuit 11 and may increase or reduce the output current so that the first voltage VC2 is in a prescribed voltage level period. Here, that the first voltage VC2 is in the prescribed voltage level period may mean that the phase difference enters the locking range of the fine phase detection circuit 11. When the phase difference is synchronized to the locking range of the fine phase detection circuit 11, the phase locked circuit 1 may change a state of the switch 20. That is, the phase locked circuit 1 may release an electrical connection between the oscillator VO and the coarse phase detection circuit 12 and establish an electrical connection between the oscillator VO and the fine phase detection circuit 11.

The oscillator VO outputs an output clock signal CKVCO having a frequency based on the first output voltage VO1 or the second output voltage VO2. For example, when the oscillator VO receives a high level voltage, a signal having a high frequency may be output. In other words, the oscillator VO may be based on the amount of current output from the converter GM or the charge pump CP. That is, as the amount of current output from the converter GM or the charge pump CP increases, a signal having a higher frequency may be output. In an exemplary embodiment, the oscillator VO includes a voltage control oscillator.

The divider DIV receives the output clock signal CKVCO, and divides a frequency of the received output clock signal CKVCO by an integer or a fraction to output a feedback clock signal CKFB. For example, the divider DIV may include an integer-division divider or a fraction-division divider.

According to an exemplary embodiment of the inventive concept, the phase locked circuit 1 may interactively operate the fine phase detection circuit 11 and the coarse phase detection circuit 12 in order to efficiently synchronize and lock the phase difference. That is, in order to synchronize and lock the phase difference to the locking range of the fine phase detection circuit 11, which is an object of the coarse phase detection circuit 12, a detection result of the fine phase detection circuit 11 (for example, VC2) is monitored in real time to generate a monitoring result. A charge pump CP may be controlled in accordance with the monitoring result and may be rapidly and correctly switched.

Figure 2:
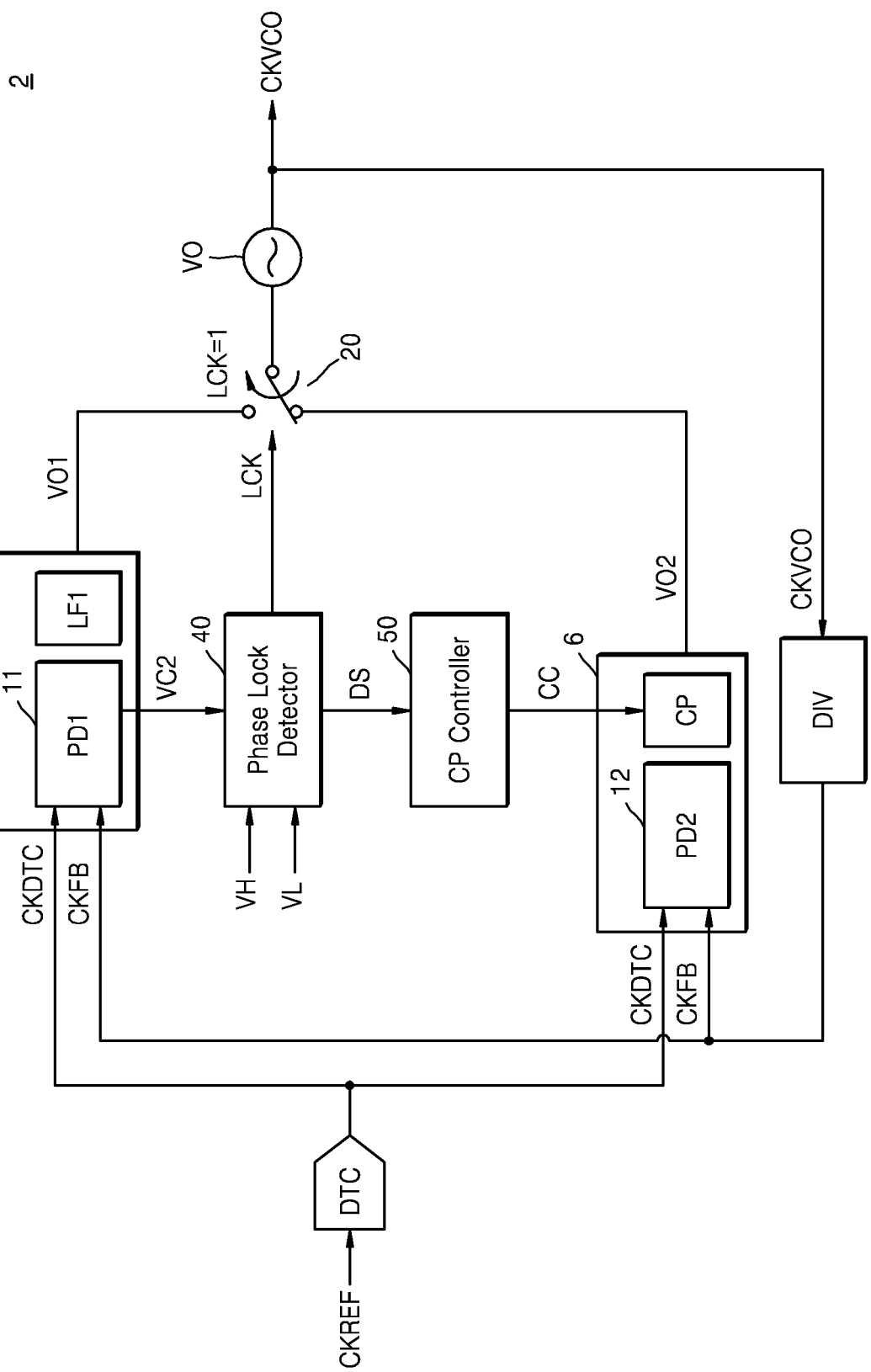
FIG. 2 is a block diagram illustrating a phase locked circuit according to an exemplary embodiment of the inventive concept.

FIG. 2 is a block diagram illustrating a phase locked circuit according to an exemplary embodiment of the inventive concept. Descriptions previously made with reference to FIG. 1 are omitted.

According to an exemplary embodiment of the inventive concept, the phase locked circuit 2 includes the oscillator VO for generating the output clock signal CKVCO and the first phase detector 5 for detecting the phase difference of the feedback clock signal CKFB based on the input clock signal CKDTC and the output clock signal CKVCO. In addition, the phase locked circuit 2 includes the second phase detector 6 having a wider phase locking range than the first phase detector 5, for detecting a phase difference between the input clock signal CKDTC and the feedback clock signal CKFB. In an exemplary embodiment, based on the detection result of the first phase detector 5, the phase locked circuit 2 includes a charge pump controller 50 (e.g., a control circuit) for controlling the output current (for example, IO of FIG. 8) of the charge pump CP included in the second phase detector 6. When the phase difference between the input clock signal CKDTC and the feedback clock signal CKFB is within the phase locking range of the fine phase detection circuit 11 (for example, a phase locking confirmation signal LCK maintains a logic high state for a previously set time), the switch 20 may operate so that the oscillator VO and the first phase detector 5 are connected to each other. For example, the phase locking range of the fine phase detection circuit 11 may be based on a point in time TL to a point in time TH or a point in time T12 of FIG. 5.

The phase locked circuit 2 includes the fine phase detection circuit 11, the coarse phase detection circuit 12, the switch 20, the oscillator VO, the divider DIV, a digital-time converter (DTC) 31, a phase locking detection circuit 40 (e.g., a phase lock detector), and the charge pump controller 50.

The phase locking detection circuit 40 receives the first voltage VC2 indicating a phase difference and outputs a first detection signal DS indicating whether a level of the first voltage VC2 is included in a previously set voltage level period. For example, the previously set voltage level period may be lower than a level of an upper limit voltage VH and higher than a level of a lower limit voltage VL. For example, the upper limit voltage VH and the lower limit voltage VL may be received from a voltage generator included in or outside the phase locked circuit 2. In another example, information on the level of the upper limit voltage VH and the level of the lower limit voltage VL may be stored in memory.

Figure 3:
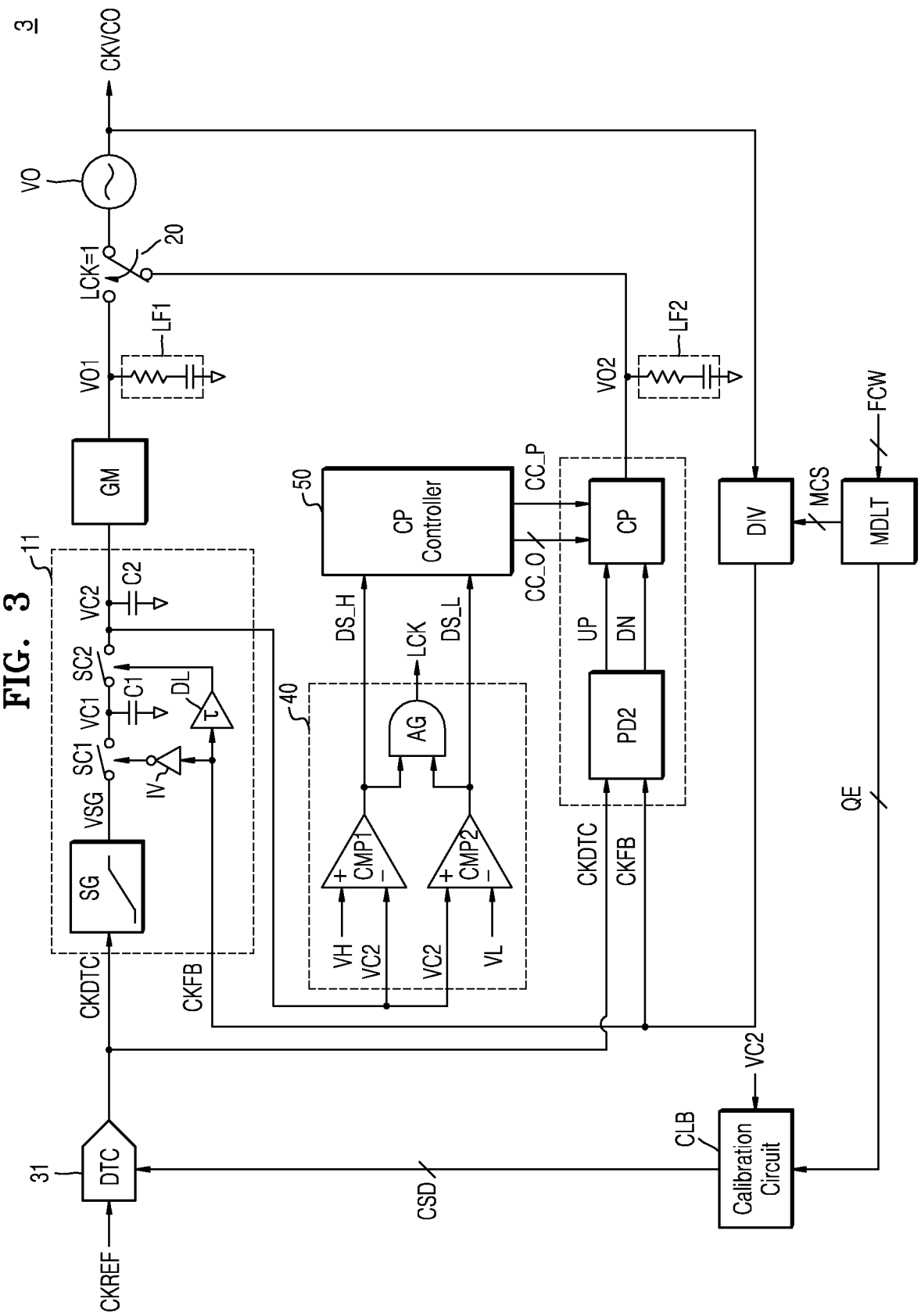
FIG. 3 is a block diagram illustrating a phase locked circuit according to an exemplary embodiment of the inventive concept.

The first detection signal DS may include an upper limit detection signal (for example, DS_L of FIG. 3) and a lower limit detection signal (for example, DS_H of FIG. 3). For example, the upper limit detection signal may indicate that the level of the first voltage VC2 is lower than that of the upper limit voltage VH. When the level of the first voltage VC2 is lower than that of the upper limit voltage VH, the upper limit detection signal may indicate a logic high (or an activation state). To the contrary, when the level of the first voltage VC2 is higher than that of the upper limit voltage VH, the upper limit detection signal may indicate a logic low (or an inactivation state). In another example, the lower limit detection signal may indicate that the level of the first voltage VC2 is higher than that of the lower limit voltage VL. When the level of the first voltage VC2 is higher than that of the lower limit voltage VL, the lower limit detection signal may indicate a logic high. To the contrary, when the level of the first voltage VC2 is lower than that of the lower limit voltage VL, the lower limit detection signal may indicate a logic low.

According to an exemplary embodiment of the inventive concept, the level of the first voltage VC2 means the phase difference between the input clock signal CKDTC and the feedback clock signal CKFB. For example, when the phase difference is small, the level of the first voltage VC2 may be low and, when the phase difference is large, the level of the first voltage VC2 may be high. For example, a phase of the feedback clock signal CKFB may be later than that of the input clock signal CKDTC by a first value. In another example, the phase of the feedback clock signal CKFB may be later than that of the input clock signal CKDTC by a second value. In an exemplary embodiment, the first value is greater than the second value. In this case, the level of the first voltage VC2 when the phase difference has the first value is higher than that of the first voltage VC2 when the phase difference has the second value. When the level of the first voltage VC2 is greater than the lower limit voltage VL and less than the upper limit voltage VH, the phase locking detection circuit 40 determines that the phase difference between the input clock signal CKDTC and the feedback clock signal CKFB is included in the locking range of the fine phase detection circuit 11. The lower limit voltage VL may correspond to the minimum phase value in a locking range in which the fine phase detection circuit 11 may perform a phase locking operation. To the contrary, the upper limit voltage VH may correspond to the maximum phase value in the locking range in which the fine phase detection circuit 11 may perform the phase locking operation.

The phase locking detection circuit 40 may output the phase locking confirmation signal LCK. The output of the phase locking confirmation signal LCK may mean that the first voltage VC2 enters the previously set voltage level period for a uniform time. For example, the phase locked circuit 2 may further include a counter. The counter may start counting from a point in time when the first voltage VC2 enters the previously set voltage level period. When counting is performed for a previously set time, the phase locked circuit 2 may output the phase locking confirmation signal LCK to the switch 20. The switch 20 may perform a switching operation in response to reception of the phase locking confirmation signal LCK.

The charge pump controller 50 may control the amount of current output from the charge pump CP. For example, the charge pump controller 50 may output a charge pump control signal CC for controlling the charge pump CP based on the first detection signal DS.

According to an exemplary embodiment of the inventive concept, the charge pump controller 50 may receive the first detection signal DS that indicates that the level of the first voltage VC2 is higher than that of the upper limit voltage VH. That is, the phase difference between the input clock signal CKDTC and the feedback clock signal CKFB may be so large that the fine phase detection circuit 11 does not perform the locking operation. In this case, the charge pump controller 50 may reduce the amount of current output from the charge pump CP. That is, the charge pump controller 50 may output the charge pump control signal CC that instructs reduction in the amount of current output from the charge pump CP. In an embodiment, a current may be output in a direction in which a charge pump circuit (for example, CPC of FIG. 9) pushes the current to the loop filter (for example, LF2 of FIG. 9). The charge pump controller 50 may output a current in a direction in which an offset circuit (for example, CPO of FIG. 9) included in the charge pump CP pulls the current from the loop filter. As a result, the charge pump controller 50 may reduce the total amount of current output from the charge pump CP. In another example, the charge pump controller 50 may receive the first detection signal DS that indicates that the level of the first voltage VC2 is lower than that of the lower limit voltage VL. In this case, the charge pump controller 50 may increase the amount of current output from the charge pump CP. Since the above operation is opposite to the operation in the previously described example, a detailed description thereof is omitted.

According to an exemplary embodiment of the inventive concept, the charge pump controller 50 may output charge pump control signals CC_O and CC_P so as to increase the amount of offset current output from the charge pump CP to the second loop filter LF2 when the phase of the feedback clock signal CKFB is later than a target phase and to increase the amount of offset current received by the charge pump CP from the second loop filter LF2 when the phase of the feedback clock signal CKFB is earlier than a target phase.

Figure 5:
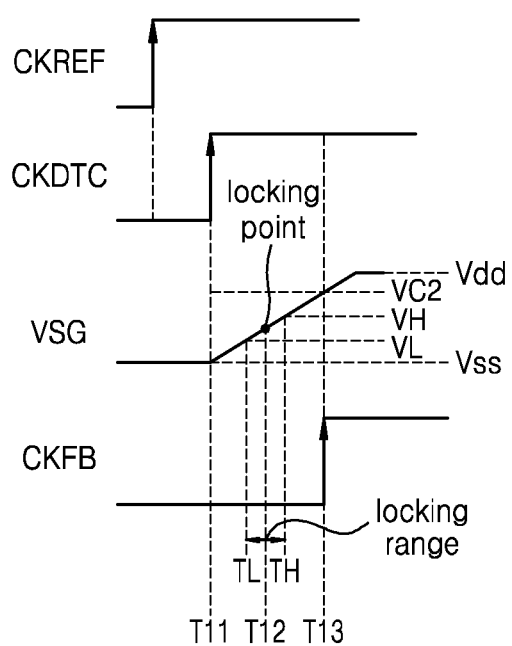
FIG. 5 is a waveform diagram illustrating a reference clock signal, an input clock signal, a slope voltage, and a feedback clock signal.

For example, the target phase may be based on the point in time T12 or the point in time TL to the point in time TH of FIG. 5.

The switch 20 may include an analog or digital switch. For example, the switch 20 may include one transistor or a combination of a plurality of transistors. In another example, the switch 20 may include a multiplexer. In this case, the phase locking confirmation signal LCK may be input to a control terminal (which may be referred to as a selection terminal or an enable terminal) of the multiplexer. According to an exemplary embodiment, in response to transition of the phase locking confirmation signal LCK to a logic high, the switch 20 may be configured to release a channel formed between the coarse phase detection circuit 12 and the oscillator VO and to form a channel between the fine phase detection circuit 11 and the oscillator VO.

A DTC (Digital-Time Converter) 31 may receive a reference clock signal CKREF and delay the reference clock signal CKREF by a uniform time to output the input clock signal CKDTC. The DTC 31 may delay the reference clock signal CKREF by various methods. For example, the DTC 31 may delay the reference clock signal CKREF based on a command of control code received from external logic of the DTC 31. Detailed description will be made later with reference to FIG. 3.

FIG. 3 is a block diagram illustrating a phase locked circuit 3 according to an exemplary embodiment of the inventive concept.

Referring to FIG. 3, the phase locked circuit 3 includes the fine phase detection circuit 11, the converter GM, the first loop filter LF1, the coarse phase detection circuit 12, the second loop filter LF2, the switch 20, the oscillator VO, the DTC 31, the phase locking detection circuit 40, the charge pump controller 50, the divider DIV, a modulator MDLT, and a calibration circuit CLB.

The DTC 31 may delay the reference clock signal CKREF by an amount of delay (time delay or phase delay) corresponding to an input code CSD to generate the input clock signal CKDTC and may output the input clock signal CKDTC. The DTC 31 may generate the amount of delay by various methods. For example, the DTC 31 may generate the delay time by a method of selecting delay cells of a number corresponding to the input code CSD among the plurality of delay cells. In addition, the DTC 31 may generate the amount of delay by a method of charging and pre-charging a passive device based on a current corresponding to the input code CSD. However, the inventive concept is not limited thereto. The DTC 31 may operate by various methods.

The modulator MDLT receives a frequency control command FCW and generates a control signal MCS for the divider DIV in accordance with the frequency control command FCW. The modulator MDLT may be implemented by various methods. For example, the modulator MDLT may include a delta-sigma modulator.

The modulator MDLT may provide an integer division ratio to the divider DIV. For example, when the divider DIV is configured to divide the output clock signal CKVCO by one of division ratios K−1, K, and K+1 (K is an integer), the modulator MDLT may select one of the integer division ratios K−1, K, and K+1 every loop so that an average division ratio may have a desired value and may provide the selected integer division ratio (or a coefficient that represents the selected integer division ratio) to the divider DIV as the control signal MCS.

For example, assuming that the divider DIV is set to divide the output clock signal CKVCO by one of the division ratios K and K+1, the basic division ratio K is 2, and the average division ratio is 2.25, the modulator MDLT may receive a decimal of 0.25 as the frequency control command FCW. The modulator MDLT may perform a divide by 2 threes and may perform a divide by 3 once based on set integer division ratios 2 and 3 in order to make the average division ratio 2.25. Therefore, the modulator MDLT may output the control signal MCS such as '0', '0', '0', or '1' that represents a value added to the basic division ratio to the divider DIV. At this time, one of the control signals '0', '0', '0', and '1' may be randomly selected. The divider DIV may change a division ratio based on the received control signal MCS.

In an exemplary embodiment, as the integer division ratio changes, a quantum error QE may occur. Quantum noise is generated by the phase locked circuit 3 due to a difference between the integer division ratio that is a real time division ratio and a fraction division ratio that is the average division ratio. Therefore, the modulator MDLT may provide the quantum error QE to the calibration circuit CLB and the calibration circuit CLB may adjust the input code CSD based on the quantum error QE so that the amount of delay of the DTC 31 corresponds to the quantum error QE.

In an embodiment, the calibration circuit CLB outputs the input code CSD based on the first voltage VC2 and the quantum error QE. The amount of delay of the DTC 31 may be a value obtained by multiplying a period of the output clock signal CKVCO having a target frequency by the quantum error QE. The amount of delay $D_{DTC}$ may be represented by the following EQUATION 1.

$$D_{DTC} = T_{OUT} * QE = K_D * G_{DTC} * QE \quad [\text{EQUATION 1}]$$

wherein, $D_{DTC}$ represents the amount of delay of the DTC 31, $T_{OUT}$ represents a period of the output clock signal CKVCO having the target frequency, $K_D$ represents a unit resolution (time that may be delayed per digital code) of the DTC 31, and $G_{DTC}$ represents a gain value of the DTC 31.

The calibration circuit CLB may calculate the gain value of the DTC 31 based on the first voltage VC2 and the quantum error QE. For example, the calibration circuit CLB may output a correlation value between a sign of the first voltage VC2 and a sign of the quantum error QE, may accumulate the correlation value, and may calculate the gain value of the DTC 31. As a result, the calibration circuit CLB may output the input code CSD that indicates the amount of delay of the DTC 31 by using the first voltage VC2 and the quantum error QE.

The fine phase detection circuit 11 may detect the phase difference between the input clock signal CKDTC and the feedback clock signal CKFB to output the first voltage VC2 to at least one of the converter GM, the phase locking detection circuit 40, and the calibration circuit CLB. Hereinafter, an operation of the fine phase detection circuit 11 will be described later with reference to FIGS. 4 and 5.

Figure 4:
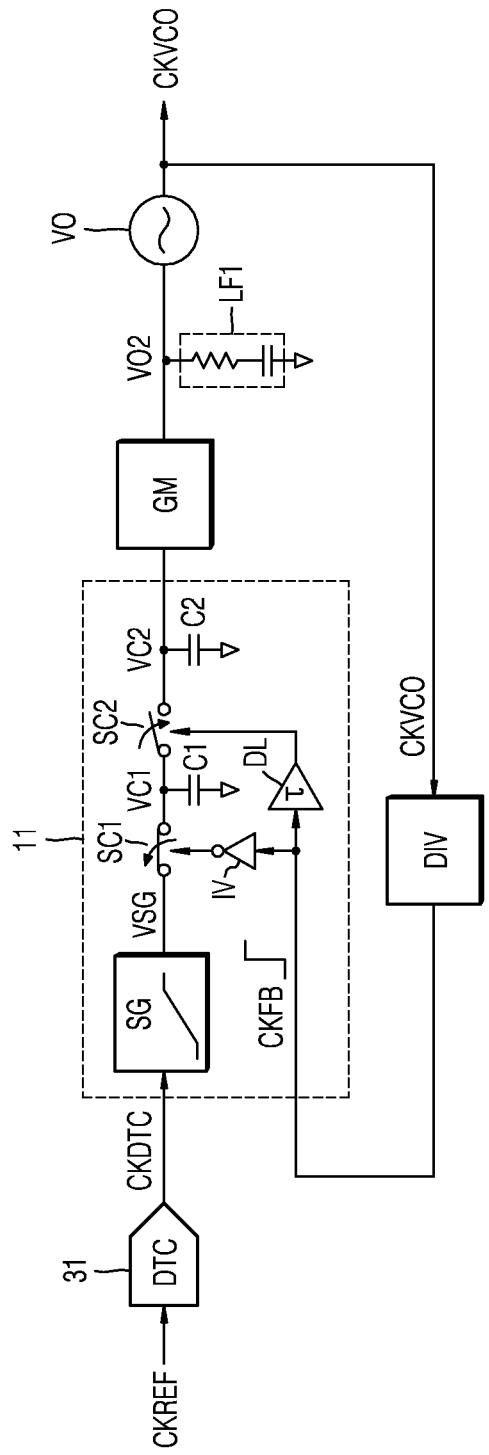
FIG. 4 is a block diagram illustrating a fine phase detection circuit according to an exemplary embodiment of the inventive concept.

FIG. 4 is a block diagram illustrating the fine phase detection circuit 11 according to an exemplary embodiment of the inventive concept, and FIG. 5 is a waveform diagram illustrating the reference clock signal CKREF, the input clock signal CKDTC, a slope voltage VSG, and the feedback clock signal CKFB. The horizontal axis of FIG. 5 represents time and the vertical axis thereof represents a voltage level.

Referring to FIG. 4, the fine phase detection circuit 11 includes a slope generator SG, first and second switches SC1 and SC2, a plurality of capacitors C1 and C2, an inverter IV, and a delay unit DL (e.g., a buffer or an operational amplifier). The fine phase detection circuit 11 may receive the input clock signal CKDTC, may integrate the received input clock signal CKDTC in accordance with time, and may output the slope voltage VSG.

Referring to FIGS. 4 and 5, the slope generator SG may generate the slope voltage VSG by integrating the input clock signal CKDTC in accordance with time from a first point in time T11 at which a rising edge of the input clock signal CKDTC is generated. The slope voltage VSG may have a prescribed slope. For example, the slope may be determined by a gain value of the slope generator SG. In addition, the slope voltage VSG may have a ground voltage level Vss as a lowest level and may have a driving voltage level Vdd as a highest level. For example, when the gain value of the slope generator SG is large, a slope of the slope voltage VSG may increase and the level of the slope voltage VSG may reach the driving voltage level Vdd in less time. On the other hand, the driving voltage level Vdd may be determined based on a driving voltage applied to the slope generator SG or may be determined based on a driving voltage applied to an inside or outside of the phase locked circuit 3. The ground voltage level Vss may be a voltage level of a ground terminal of the slope generator SG or may be a voltage level of a ground terminal connected to at least one of components of the phase locked circuit 3.

The fine phase detection circuit 11 may sample the first voltage VC2 based on timing of a rising edge of the feedback clock signal CKFB. In other words, at the timing of the rising edge of the feedback clock signal CKFB, a particular voltage level of the slope voltage VSG may be sampled. The fine phase detection circuit 11 may perform a sampling operation as follows by using the first switch SC1 and the second switch SC2. The fine phase detection circuit 11 may turn on the first switch SC1 so as to charge the slope voltage VSG in a first capacitor C1. At this time, the inverter IV may output a logic high control signal to the first switch SC1 in response to a logic low of the feedback clock signal CKFB. The first switch SC1 may be turned on in response to reception of the logic high control signal. For example, the first switch SC1 may receive the logic high control signal at the first point in time T11 or at a previous point in time.

A level of a voltage VC1 applied to the first capacitor C1 may rise with a prescribed slope from the first point in time T11 or the previous point in time. While the level of the voltage VC1 increases, the fine phase detection circuit 11 may receive the feedback clock signal CKFB having the rising edge. Based on the rising edge of the feedback clock signal CKFB, the first switch SC1 may be turned off. This is because the control signal applied to the first switch SC1 is a falling edge (that is, a logic low signal) obtained by inverting the rising edge. In addition, the delay unit DL may delay the rising edge of the feedback clock signal CKFB by a prescribed time τ. For example, the prescribed time τ may be determined based on time delayed for the slope generator SG to generate a voltage with a prescribed slope and prescribed delay time of the inverter IV. After the first switch SC1 is turned off, the second switch SC2 may be turned on based on the rising edge (that is, the logic high signal) of the feedback clock signal CKFB. An amount of charge charged in the first capacitor C1 may be distributed to a second capacitor C2 via the turned on second switch SC2 and may generate the first voltage VC2. As the second switch SC2 is turned on at a third point in time T13, the first voltage VC2 may have a particular level. The particular level (that is, the level of the first voltage VC2) may reflect the phase difference (for example, T13 to T12) between the input clock signal CKDTC and the feedback clock signal CKFB. This is because the second point in time T12 is a locking point targeted by the phase locked circuit 3.

Referring to FIG. 5, when the rising edge of the feedback clock signal CKFB is generated later than a target point in time, the phase locked circuit 3 may increase the phase of the feedback clock signal CKFB. That is, since the rising edge of the currently applied feedback clock signal CKFB is generated at the third point in time T13, the phase locked circuit 3 needs to increase the phase of the feedback clock signal CKFB to the second point in time T12. Alternatively, the phase locked circuit 3 needs to increase the phase of the feedback clock signal CKFB so that the level of the first voltage VC2 enters a previously set voltage level period. That is, the phase locked circuit 3 may increase the phase of the feedback clock signal CKFB so that the third point in time T13 at which the rising edge is generated is less than a point in time corresponding to the level of the upper limit voltage VH and is greater than a point in time corresponding to the level of the lower limit voltage VL.

Referring to FIG. 3 again, the phase locked circuit 3 may increase or reduce the phase of the feedback clock signal CKFB in order to have the level of the first voltage VC2 enter the previously set voltage level period. For example, the phase locking detection circuit 40 and the charge pump controller 50 may generate an offset in the charge pump CP of the coarse phase detection circuit 12 and may increase a frequency of the oscillator VO.

The phase locking detection circuit 40 includes a first comparator CMP1 (e.g., a first comparison circuit), a second comparator CMP2 (e.g., a second comparison circuit), and an AND gate AG. The phase locking detection circuit 40 may receive the upper limit voltage VH, the lower limit voltage VL, and the first voltage VC2, may compare levels of the received voltages, and may output the phase locking confirmation signal LCK, an upper limit detection signal DS_H, and a lower limit detection signal DS_L.

The phase locking detection circuit 40 may receive the first voltage VC2 that indicates the phase difference between the input clock signal CKDTC and the feedback clock signal CKFB. The first comparator CMP1 may compare the level of the first voltage VC2 with that of the upper limit voltage VH. For example, when the level of the first voltage VC2 is lower than that of the upper limit voltage VH, the first comparator CMP1 may output the logic high upper limit detection signal DS_H.

To the contrary, when the level of the first voltage VC2 is higher than that of the upper limit voltage VH, the first comparator CMP1 may output the logic low upper limit detection signal DS_H. That is, when the level of the first voltage VC2 reaches that of the upper limit voltage VH, the upper limit detection signal DS_H may have a rising edge or a falling edge.

The second comparator CMP2 may compare the level of the first voltage VC2 with that of the lower limit voltage VL. For example, when the level of the first voltage VC2 is higher than that of the lower limit voltage VL, the first comparator CMP1 may output the logic high lower limit detection signal DS_L.

To the contrary, when the level of the first voltage VC2 is lower than that of the lower limit voltage VL, the first comparator CMP1 may output the logic low lower limit detection signal DS_L. That is, when the level of the first voltage VC2 reaches that of the lower limit voltage VL, the lower limit detection signal DS_L may have a rising edge or a falling edge.

When the first voltage VC2 enters the previously set voltage level period, the phase locking detection circuit 40 may output the logic high phase locking confirmation signal LCK. For example, the AND gate AG may receive the upper limit detection signal DS_H and the lower limit detection signal DS_L, perform an AND operation on the received signals to generate the phase locking confirmation signal LCK, and may output the phase locking confirmation signal LCK. When both the upper limit detection signal DS_H and the lower limit detection signal DS_L are logic high, the AND gate AG may output the logic high phase locking confirmation signal LCK. The switch 20 may be switched in response to transition of the phase locking confirmation signal LCK to logic high. The phase locked circuit 3 may electrically connect the fine phase detection circuit 11 to the oscillator VO. For example, the phase locked circuit 3 may disconnect the coarse phase detection circuit 12 or the second phase detector 6 from the oscillator VO and connect the fine phase detection circuit 11 to the oscillator VO when the phase locking confirmation signal LCK becomes set to logic high. In an exemplary embodiment, the phase locking confirmation signal LCK becomes set to a logic high (e.g., a first logic level) when the first voltage VC2 is between the lower limit voltage VL and the upper limit voltage VH and becomes set to a logic low (e.g., a second logic level different from the first logic level) otherwise.

The phase locking detection circuit 40 may output the upper limit detection signal DS_H and the lower limit detection signal DS_L in order to control the charge pump controller 50. For example, the charge pump controller 50 may reduce the amount of current output from the charge pump CP in response to transition of the upper limit detection signal DS_H to logic high. When the amount of current output from the charge pump CP is reduced, a level of the first output voltage VO1 output from the second loop filter LF2 may be reduced. In response to reduction in the level of the first output voltage VO1, the oscillator VO may reduce the frequency of the output clock signal CKVCO. In another example, in response to transition of the lower limit detection signal DS_L to logic high, the charge pump controller 50 may increase the amount of current output from the charge pump CP. When the amount of current output from the charge pump CP increases, the level of the first output voltage VO1 output from the second loop filter LF2 may increase. In response to an increase in the level of the first output voltage VO1, the oscillator VO may increase the frequency of the output clock signal CKVCO. The charge pump controller 50 will be described in detail later with reference to FIG. 6.

The second phase detector 6 may include the coarse phase detection circuit 12 and the charge pump CP. As described later with reference to FIGS. 8 and 9, the charge pump CP may include a charge pump circuit (CP1 of FIGS. 8 and 9) and an offset circuit (CP2 of FIGS. 8 and 9).

A second phase difference detector PD2 may output second detection signals UP and DN for indicating the phase difference between the input clock signal CKDTC and the feedback clock signal CKFB. The second detection signals may include an up detection signal UP and a down detection signal DN. For example, when the phase difference is earlier than a target value of the second phase difference detector PD2, the logic high down detection signal DN may be output and, when the phase difference is later than a target value of the second phase difference detector PD2, the logic high up detection signal UP may be output. The charge pump CP may output the current from the second loop filter LF2 based on the second detection signals UP and DN. For example, when the up detection signal UP is received, the charge pump CP may increase the amount of output current. In addition, the charge pump CP may adjust the amount of output current based on the offset control signal CC_O and the phase control signal CC_P. For example, the offset control signal CC_O indicates an amount of adjustment of the output current of the charge pump CP and the phase control signal CC_P may indicate increase or reduction in the output current of the charge pump CP.

The second loop filter LF2 may receive the current output from the charge pump CP and may output the second output voltage VO2. For example, the second loop filter LF2 may include various types of filter that may convert the received current value into a voltage, and the resistance capacitor (RC) filter illustrated in FIG. 3 is only an example.

Based on the second output voltage VO2, the oscillator VO may increase, reduce, or maintain an oscillation frequency. For example, the oscillator VO may include a voltage control oscillator. On the other hand, when a time for which the phase locking confirmation signal LCK indicates logic high is greater than the previously set time, the oscillator VO may control the oscillation frequency based on the first output voltage VO1.

According to an exemplary embodiment of the inventive concept, the phase locked circuit 3 does not additionally include the slope generator SG and accordingly, a degree of integration may increase. According to a comparative example, a replica circuit of the slope generator SG may be provided between the coarse phase detection circuit 12 and the DTC 31 in order to receive the input clock signal CKDTC input to the fine phase detection circuit 11 including the slope generator SG and the input clock signal CKDTC input to the coarse phase detection circuit 12 under the same condition. However, according to an exemplary embodiment of the inventive concept, since the charge pump CP may be controlled based on the first voltage VC2 generated by the fine phase detection circuit 11, even though the replica circuit of the slope generator SG is not provided, the phase locking operation may be performed.

Figure 6:
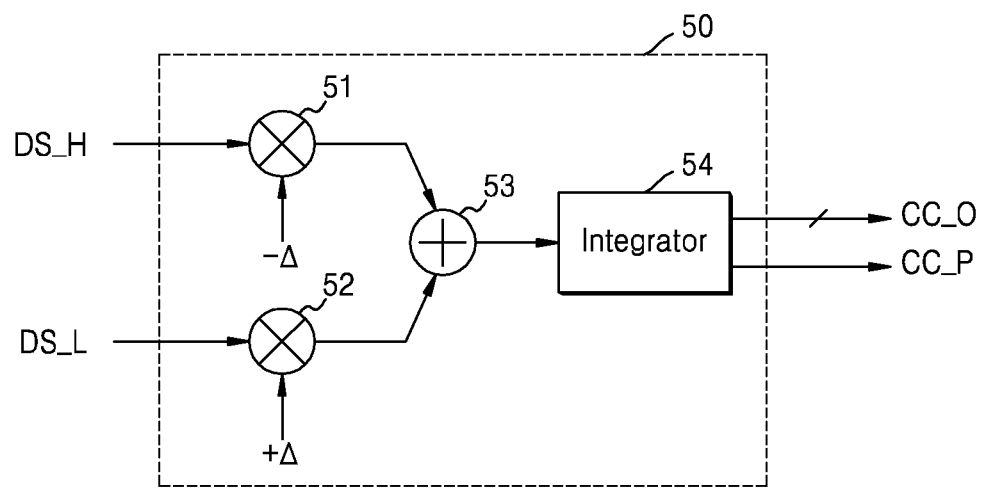
FIG. 6 is a block diagram illustrating a charge pump controller according to an exemplary embodiment of the inventive concept.

FIG. 6 is a block diagram illustrating a charge pump controller according to an exemplary embodiment of the inventive concept.

The charge pump controller 50 includes a first multiplier 51, a second multiplier 52, an adder 53, and an integrator 54. The charge pump controller 50 may receive the upper limit detection signal DS_H and may generate a first value obtained by multiplying a minus increment value −Δ by the upper limit detection signal DS_H by using the first multiplier 51. In addition, the second multiplier 52 may receive the lower limit detection signal DS_L and may generate a second value obtained by multiplying a plus increment value +Δ by the lower limit detection signal DS_L by using the second multiplier 52. The charge pump controller 50 may add the first value and the second value using the adder 53 to generate an addition result and may integrate the addition result by using the integrator 54. The integrator 54 may output the charge pump control signal (CC of FIG. 1), and the charge pump control signal may include the offset control signal CC_O and the phase control signal CC_P. The offset control signal CC_O may indicate an amount of current output from the offset circuit (CPO of FIG. 9) to be described later, and the phase control signal CC_P may indicate an increase or reduction in the current output from the charge pump (CP of FIG. 1). The offset control signal CC_O and the phase control signal CC_P will be described later with reference to FIG. 7.

Figure 7:
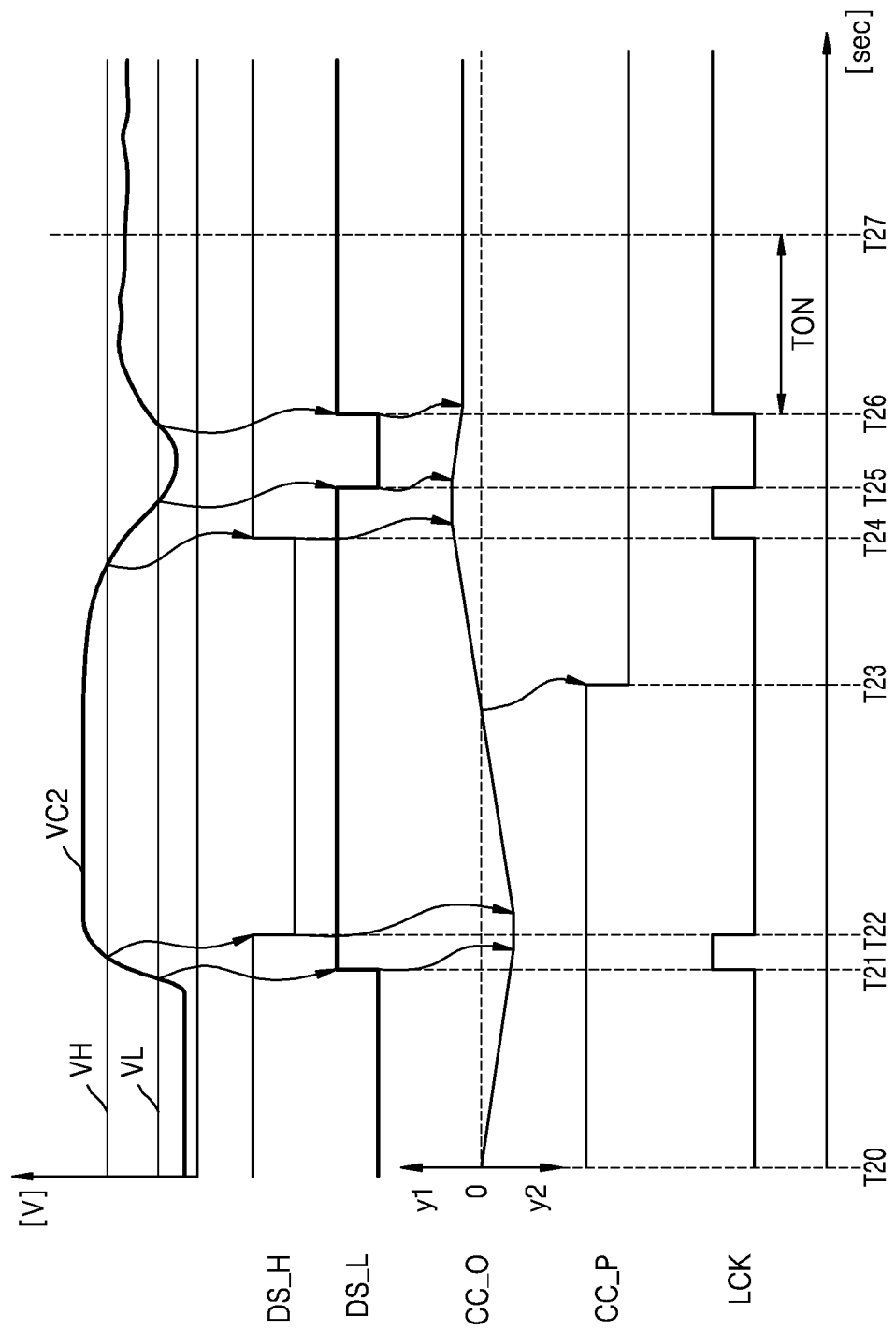
FIG. 7 is a waveform diagram illustrating various voltages and signals according to an exemplary embodiment of the inventive concept.

FIG. 7 is a waveform diagram illustrating various voltages and signals according to an exemplary embodiment of the inventive concept. Hereinafter, description will be made together with the reference numerals of FIG. 3. Referring to FIG. 7, the horizontal axis represents time and the vertical axis represents levels of respective voltages. On the other hand, the vertical axis of the offset control signal CC_O represents absolute values of amounts of currents output from first and second offset current sources (IF1 and IF2 of FIGS. 8 and 9). For example, a value from 0 to y1 represents the absolute value of the amount of current output from the first offset current source (IF1 of FIGS. 8 and 9). In another example, a value from 0 to y2 represents the absolute value of the amount of current output from the second offset current source (IF2 of FIGS. 8 and 9).

According to an exemplary embodiment of the inventive concept, when the upper limit detection signal DS_H is a logic high and the lower limit detection signal DS_L is a logic low, the offset control signal CC_O may be reduced with a prescribed slope. To the contrary, when the upper limit detection signal DS_H is a logic high and the lower limit detection signal DS_L is a logic low, the offset control signal CC_O may be reduced with a prescribed slope. At this time, the slope may correspond to the increment value (Δ of FIG. 6).

According to an exemplary embodiment of the inventive concept, the fine phase detection circuit 11 may output the first voltage VC2 that indicates the phase difference. When the level of the first voltage VC2 is lower than that of the upper limit voltage VH and higher than that of the lower limit voltage VL, it may represent that the phase difference enters the locking range of the fine phase detection circuit 11.

The first voltage VC2 may initially have a prescribed level. For example, the prescribed level may be lower than that of the upper limit voltage VH. For example, the prescribed level may be a ground voltage level. In another example, the prescribed level may correspond to a charge amount of the discharged second capacitor C2. In this case, the upper limit detection signal DS_H may be set to a logic high. In response to the logic high upper limit detection signal DS_H, a level of the offset control signal CC_O may be reduced.

When the level of the first voltage VC2 reaches that of the lower limit voltage VL, the lower limit detection signal DS_L may transition to a logic high at a point in time T21. In response to the lower limit detection signal DS_L transitioning to the logic high, the level of the offset control signal CC_O may be maintained without being reduced or increased. On the other hand, since both the upper limit detection signal DS_H and the lower limit detection signal DS_L are logic high, the phase locking confirmation signal LCK may be transition to a logic high.

When the level of the first voltage VC2 is higher than that of the upper limit voltage VH, the upper limit detection signal DS_H may transition to a logic low at a point in time T22. In response to the upper limit detection signal DS_H transitioning to logic low, the level of the offset control signal CC_O may increase and the phase locking confirmation signal LCK may transition to a logic low. For example, since a time corresponding to a difference between the point in time T21 and the point in time T22 is shorter than time TON previously set in order for the switch 20 to perform switching, the switch 20 does not perform switching.

When the offset control signal CC_O reaches 0, the phase control signal CC_P transitions to a logic low at a point in time T23. That is, the phase control signal CC_P may be set to a logic high when the offset control signal CC_O has a negative value and may be set to a logic low when the offset control signal CC_O has a positive value.

When the offset control signal CC_O has the negative value, the phase control signal CC_P may be set to a logic high. The amount of current output from the charge pump CP may be reduced in response to the logic high phase control signal CC_P. A reduction in the current amount may correspond to the negative value of the offset control signal CC_O. To the contrary, when the offset control signal CC_O has the positive value, the phase control signal CC_P be set to a logic low. The amount of current output from the charge pump CP may increase in response to the logic low phase control signal CC_P. An increase in the current amount may correspond to the positive value of the offset control signal CC_O.

Then, as the upper limit detection signal DS_H transitions to a logic high at a point in time T24, the offset control signal CC_O is maintained and the phase locking confirmation signal LCK transitions to a logic high. Since a time corresponding to a difference between the point in time T24 and a point in time T25 is shorter than the time TON previously set in order for the switch 20 to perform switching, the switch 20 does not perform switching. Since the lower limit detection signal DS_L transitions to a logic low at the point in time T25, the offset control signal is reduced and the phase locking confirmation signal LCK may transition to a logic low.

A time during which the level of the first voltage VC2 is higher than that of the lower limit voltage VL and is maintained to be lower than that of the upper limit voltage VH may be greater than the previously set time TON. That is, to ensure a sufficient time, the phase difference between the input clock signal CKDTC and the feedback clock signal CKFB may be included in the locking range of the fine phase detection circuit 11. In this case, when the previously set time TON passes, at a point in time T27, the phase locked circuit 3 may control the switch 20. Since the switch 20 performs switching, an electrical connection between the fine phase detection circuit 11 and the oscillator VO may be established.

According to the above-described example, the charge pump control signal CC includes the offset control signal CC_O and the phase control signal CC_P, the offset control signal CC_O indicates an absolute value, and the phase control signal CC_P may be a logic signal that indicates a direction of a current (that is, a sign of a current). According to an exemplary embodiment of the inventive concept, the charge pump control signal (CC of FIG. 1) may be implemented by a digital signal having a sign. For example, the charge pump control signal CC may have a negative sign from a point in time T20 to the point in time T23 and may have a positive sign from the point in time T23.

Figure 8:
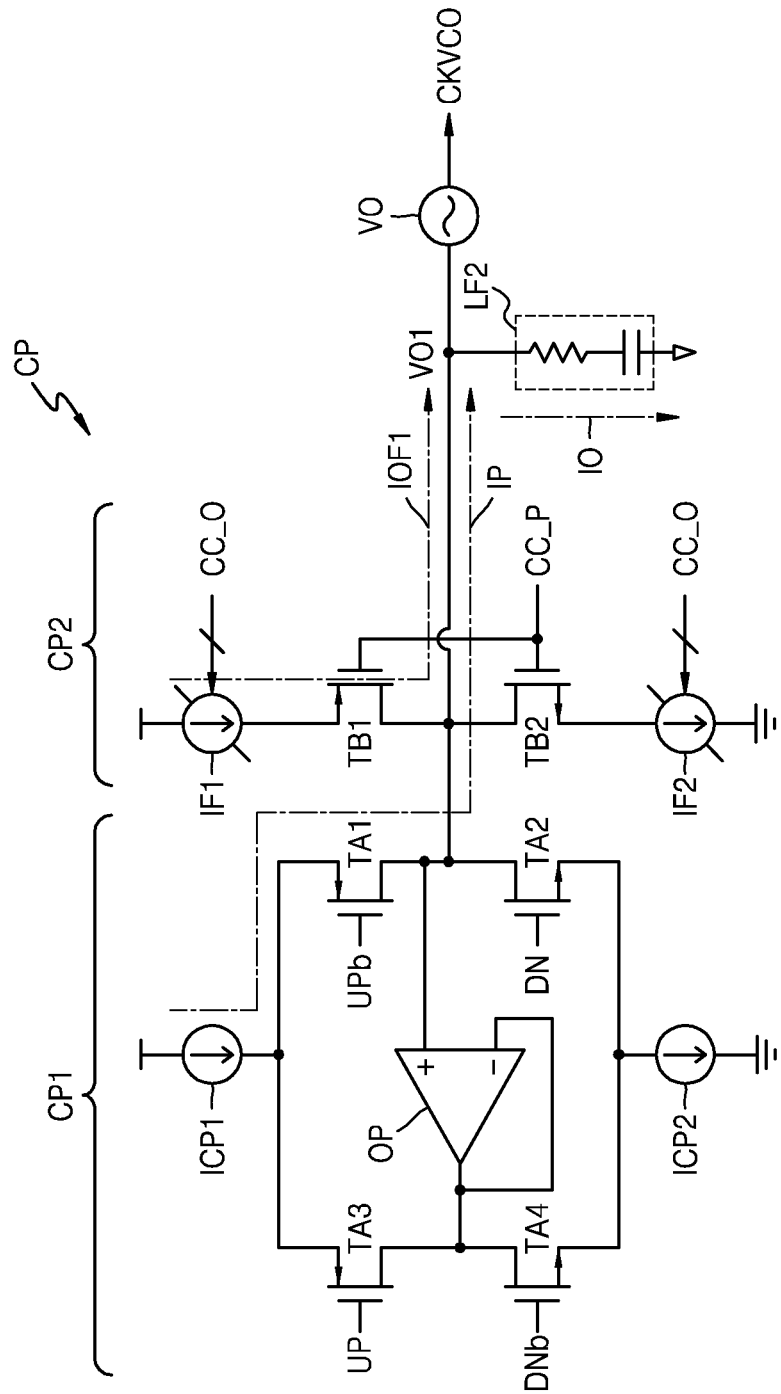
FIG. 8 is a circuit diagram illustrating a charge pump that receives a logic low phase control signal according to an exemplary embodiment of the inventive concept.
Figure 9:
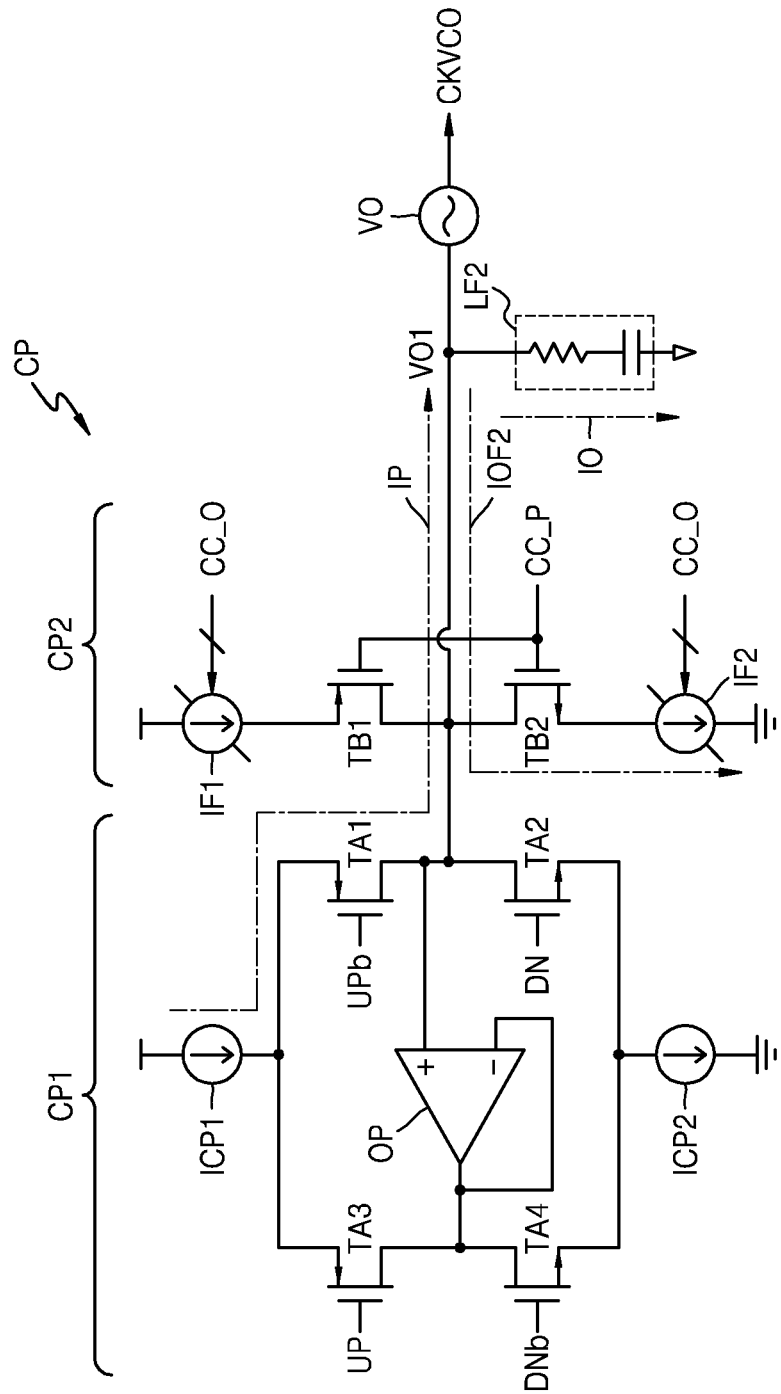
FIG. 9 is a circuit diagram illustrating a charge pump that receives a logic high phase control signal according to an exemplary embodiment of the inventive concept.

FIG. 8 is a circuit diagram illustrating a charge pump that receives a logic low phase control signal according to an exemplary embodiment of the inventive concept, and FIG. 9 is a circuit diagram illustrating a charge pump that receives a logic high phase control signal according to an exemplary embodiment of the inventive concept. The charge pump depicted in FIG. 8 and FIG. 9 may be used to implement the charge pump CP illustrated in FIG. 2 or FIG. 3.

Referring to FIGS. 8 and 9, the charge pump CP includes the charge pump circuit CP1 and the offset circuit CP2. The charge pump circuit CP1 may receive the up detection signal UP, the down detection signal DN, an up-bar signal UPb, and a down-bar signal DNb and may output a pump current IP. An amount of the pump current IP may correspond to an amount of current output from a first pump current source ICP1 or a second pump current source ICP2. For example, amounts of currents output from the first pump current source ICP1 and the second pump current source ICP2 may be actually the same. In an operation amplifier OP, a first input end (+) (e.g., a first input terminal) may be connected to a node at the first output voltage VO1 and a second input end (−) (e.g. a second input terminal) may be connected to an output end of the operation amplifier OP. For example, the operation amplifier OP may function as a buffer. In other words, a voltage of a node in which a first switch TA1 and a second switch TA2 are connected to each other may be actually the same as that of a node in which a third switch TA3 and a fourth switch TA4 are connected to each other.

The offset circuit CP2 includes the first offset current source IF1, the second offset current source IF2, a first offset switch TB1, and a second offset switch TB2. Each of the first and second offset current sources IF1 and IF2 may include a plurality of current sources. The first and second offset switches TB1 and TB2 may include transistors. For example, the first offset switch TB1 may include a p-type metal oxide semiconductor (PMOS) transistor and the second offset switch TB2 may include an n-type metal oxide semiconductor (NMOS) transistor.

The first and second offset switches TB1 and TB2 may determine directions of first and second offset currents IOF1 and IOF2 output from the first and second offset current sources IF1 and IF2 based on the offset control signal CC_O. That is, the phase control signal CC_P may control at least one switch (for example, TB1) that determines a direction of a current output from the offset circuit CP2.

The output current IO of the charge pump CP may be increased or reduced based on an output of the offset circuit CP2.

Referring to FIG. 8, when the logic low phase control signal CC_P is received, the first offset switch TB1 is turned on and the second offset switch TB2 is turned off. For example, the first offset switch TB1 may be implemented by a PMOS transistor and the second offset switch TB2 may be implemented by a NMOS transistor. However, the inventive concept is not limited thereto. The offset circuit CP2 outputs the first offset current IOF1 to the second loop filter LF2. In an exemplary embodiment, when the amount of the output current IO increases, the oscillator VO increases the frequency of the output clock signal CKVCO.

Referring to FIG. 9, when the logic high phase control signal CC_P is received, the first offset switch TB1 is turned off and the second offset switch TB2 is turned on. The second offset current IOF2 having a direction opposite to that of the first offset current IOF1 may be output. That is, the offset circuit CP2 may output the second offset current IOF2 discharged from the second loop filter LF2. In an exemplary embodiment, when the amount of the output current IO is reduced, the oscillator VO reduces the frequency of the output clock signal CKVCO.

According to an exemplary embodiment of the inventive concept, the offset control signal CC_O may indicate amounts of the first and second offset currents IOF1 and IOF2 output from the offset circuit CP2 and the phase control signal CC_P may indicate an increase or a reduction in the output current IO. On the other hand, the first offset current IOF1 and the second offset current IOF2 may flow in the charge pump CP in opposite directions.

According to an exemplary embodiment of the inventive concept, the amounts of currents output from the first and second offset current sources IF1 and IF2 may be less than those of currents output from the first and second pump current sources ICP1 and ICP2, which is for stably maintaining a phase locking operation performed by the coarse phase detection circuit 12 by the first and second offset current sources IF1 and IF2. For ease of discussion, hereinafter, one of the first and second offset current sources IF1 and IF2 is referred to as an offset current source, one of the first and second pump current sources ICP1 and ICP2 is referred to as a pump current source, the amounts of currents output from the first and second offset current sources IF1 and IF2 are the same, and the amounts of currents output from the first and second pump current sources ICP1 and ICP2 are the same.

According to an exemplary embodiment of the inventive concept, the current amount of the offset current source is less than that of the pump current source. For example, a gain value of a first loop including the fine phase detection circuit 11, the phase locking detection circuit 40, and the charge pump controller 50 is less than a gain value of a second loop including the second phase difference detector PD2 and the charge pump CP. When the output of the offset circuit CP2 is excessively high, the phase locking operation performed by the coarse phase detection circuit 12 may be prevented. An operation condition under which the offset circuit CP2 does not deteriorate the phase locking operation and the output clock signal CKVCO may be stably locked may be represented by EQUATION 2.

$$\frac{K*\Delta*IOF}{F} \le \frac{1}{20}*IP \qquad \text{[EQUATION 2]}$$

wherein, K represents a gain value of the slope generator (SG of FIG. 3), Δ represents the increment value (refer to FIG. 6) used for the charge pump controller 50, F represents a frequency of the reference clock signal (CKREF of FIG. 3), IOF represents the current amount of the offset current source, and IP represents the current amount of the pump current source.

EQUATION 2 may be rearranged to form EQUATION 3, which may be expressed as follows.

$$10F \le \left(\frac{1}{20}*IP*F\right)/(K*\Delta) \qquad \text{[EQUATION 3]}$$

wherein, 1/20 as a coefficient having a threshold effect for stably locking the output clock signal CKVCO may be a value obtained by repetitive experiment data. The current amount IOF of the offset current source may be set so that the coefficient is 1/20 or has a value similar to 1/20. In an embodiment, when K=5[GV/s], Δ=1, and F=104 [MHz], the current amount IOF of the offset current source is set to have a value of no more than 0.00104*IP. That is, the current amount IOF of the offset current source may be controlled to satisfy IOF≤0.00104*IP. In another embodiment, when K=5[GV/s], Δ=0.001, and F=104 [MHz], the current amount IOF of the offset current source is set to have a value of no more than 1.04*IP. That is, the current amount IOF of the offset current source may be controlled to satisfy IOF≤1.04*IP. In another embodiment, when K=2.5[GV/s], Δ=0.1, and F=104 [MHz], the current amount IOF of the offset current source is set to have a value of no more than 0.0208*IP. That is, the current amount IOF of the offset current source may be controlled to satisfy IOF≤0.0208*IP.

Figure 10:
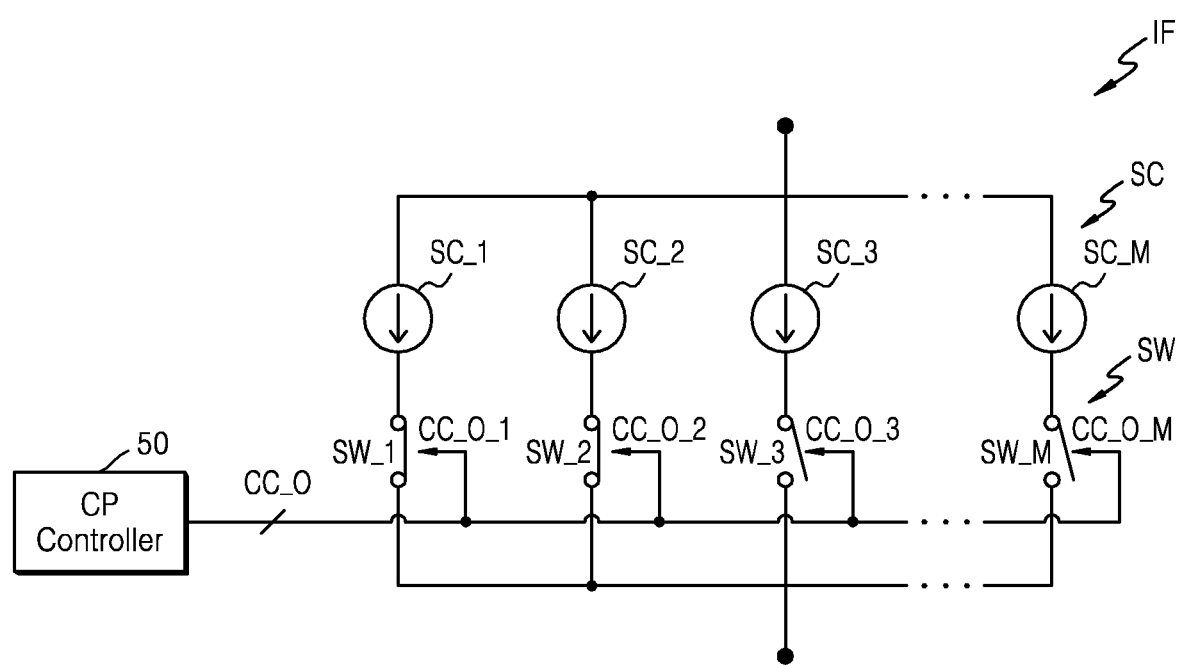
FIG. 10 is a circuit diagram illustrating an offset control signal and an offset current unit according to an exemplary embodiment of the inventive concept.

FIG. 10 is a circuit diagram illustrating an offset control signal and an offset current unit according to an exemplary embodiment of the inventive concept.

Referring to FIG. 10, an offset current source IF includes a plurality of current sources SC_1 to SC_M (e.g., SC_1, SC_2, SC_3) and a plurality of switches SW_1 to SW_M (e.g., SW_1, SW_2, SW_3). Each current source SC is connected to a corresponding switch SW. The switch SW may perform an switching operation based on the offset control signal CC_O. That is, the offset control signal CC_O may control at least one switch SW connected to at least one current source SC included in the offset current source IF. For example, the offset control signal CC_O may be a data signal configured by a plurality of bits and may include information that indicates operations of the plurality of switches SW_1 to SW_M. For example, the charge pump controller 50 may turn on a higher number of switches SW_1 to SW_M as a difference between the phase difference between the input clock signal CKDTC and the feedback clock signal CKFB and the target value is greater. For example, the charge pump controller 50 may turn on switch SW_1 using a first offset control signal CC_O_1 of the offset control signal CC_O, may turn on SW_2 using a second offset control signal CC_O_2 of the offset control signal CC_O, may turn on SW_3 using a third offset control signal CC_O_3 of the offset control signal CC_O, and may turn on SW_M using a m-th offset control signal CC_O_M of the offset control signal CC_O.

Figure 11:
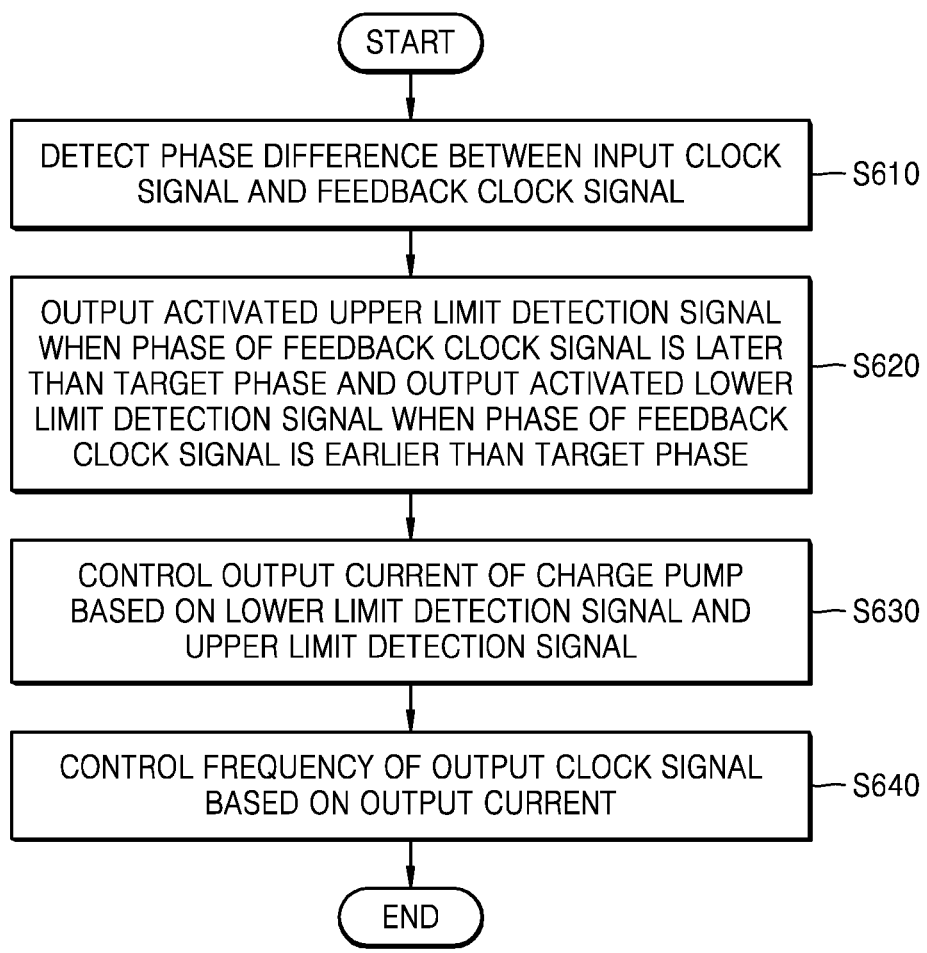
FIG. 11 is a flowchart illustrating a method of operating a phased detection circuit according to an exemplary embodiment of the inventive concept.

FIG. 11 is a flowchart illustrating a method of operating a phased detection circuit according to an exemplary embodiment of the inventive concept. Description will be made together with the reference numerals of FIG. 3.

Referring to FIG. 11, the fine phase detection circuit 11 detects the phase difference between the input clock signal CKDTC and the feedback clock signal CKFB in operation S610. The fine phase detection circuit 11 outputs the first voltage VC2 that indicates the phase difference. The first voltage VC2 has a higher level when the phase difference is greater than the target value and has a lower level when the phase difference is less than the target value. For example, the first voltage VC2 has a first value when the phase difference is greater than the target value and has a second value when the phase difference is less than the target value, wherein the first value is greater than the second value.

The phase locking detection circuit 40 outputs the logic high upper limit detection signal DS_H when the phase of the feedback clock signal CKFB is later than the target phase and outputs the logic high lower limit detection signal DS_L when the phase of the feedback clock signal CKFB is earlier than the target phase in operation S620. For example, the phase locking detection circuit 40 may output the upper limit detection signal DS_H and the lower limit detection signal DS_L by comparing the upper limit voltage VH, the lower limit voltage VL, and the first voltage VC2. The target phase may correspond to one of the point in time TL and the point in time TH described in FIG. 5. For example, when the rising edge of the feedback clock signal CKFB is generated at the point in time T13, the phase of the feedback clock signal CKFB may be later than the target phase (for example, the point in time TH). Therefore, the phase locking detection circuit 40 may output the logic high upper limit detection signal DS_H.

The phase locking detection circuit 40 may output the phase locking confirmation signal LCK that transitions to a logic high in response to logic high of the upper limit detection signal DS_H and the lower limit detection signal DS_L. For example, the phase locking confirmation signal LCK may be obtained by performing an AND operation on the upper limit detection signal DS_H and the lower limit detection signal DS_L. For a previously set time (for example, TON of FIG. 7), when the phase locking confirmation signal LCK is a logic high, the switch 20 may perform the switching operation. That is, the oscillator VO for outputting the output clock signal CKVCO may establish an electrical connection to the fine phase detection circuit 11 and may release an electrical connection from the coarse phase detection circuit 12. Therefore, the phase locked circuit 3 may perform a fine phase locking operation.

On the other hand, the upper limit detection signal DS_H may indicate a logic high when the phase difference between the input clock signal CKDTC and the feedback clock signal CKFB is greater than a first threshold value and the lower limit detection signal DS_L may indicate a logic high when the phase difference between the input clock signal CKDTC and the feedback clock signal CKFB is greater than a second threshold value. For example, referring to FIG. 5, when the point in time T13 at which the rising edge of the feedback clock signal CKFB is generated is later than the point in time TH, the upper limit detection signal DS_H may indicate a logic high. On the other hand, when the point in time T13 is earlier than the point in time TL, the lower limit detection signal DS_L may indicate a logic high.

The charge pump controller 50 controls the output current IO of the charge pump CP connected to the coarse phase detection circuit 12 based on the upper limit detection signal DS_H and the lower limit detection signal DS_L in operation S630. For example, the charge pump controller 50 may generate the charge pump control signals (CC_O and CC_P of FIG. 8) and may output the charge pump control signals CC_O and CC_P to the offset circuit (CP2 of FIG. 8) based on the upper limit detection signal DS_H and the lower limit detection signal DS_L. The charge pump controller 50 may control the output current IO based on the logic high lower limit detection signal DS_L. The charge pump CP may control (increase or reduce) the output current IO based on the offset current output from the offset circuit CP2. For example, the offset circuit CP2 may increase the first offset current (IOF1 of FIG. 8) or may reduce the second offset current (IOF2 of FIG. 9) in response to a logic high of the upper limit detection signal DS_H. In another example, the offset circuit CP2 may reduce the first offset current IOF1 or may increase the second offset current IOF2 in response to a logic high of the lower limit detection signal DS_L.

The oscillator VO controls the frequency of the output clock signal CKVCO based on the output current IO in operation S640. The second loop filter LF2 may output the second output voltage VO2 based on the output current IO to the oscillator VO. The oscillator VO may increase the frequency of the output clock signal CKVCO based on the logic high upper limit detection signal DS_H. To the contrary, the oscillator VO may reduce the frequency of the output clock signal CKVCO based on the logic high lower limit detection signal DS_L.

Figure 12:
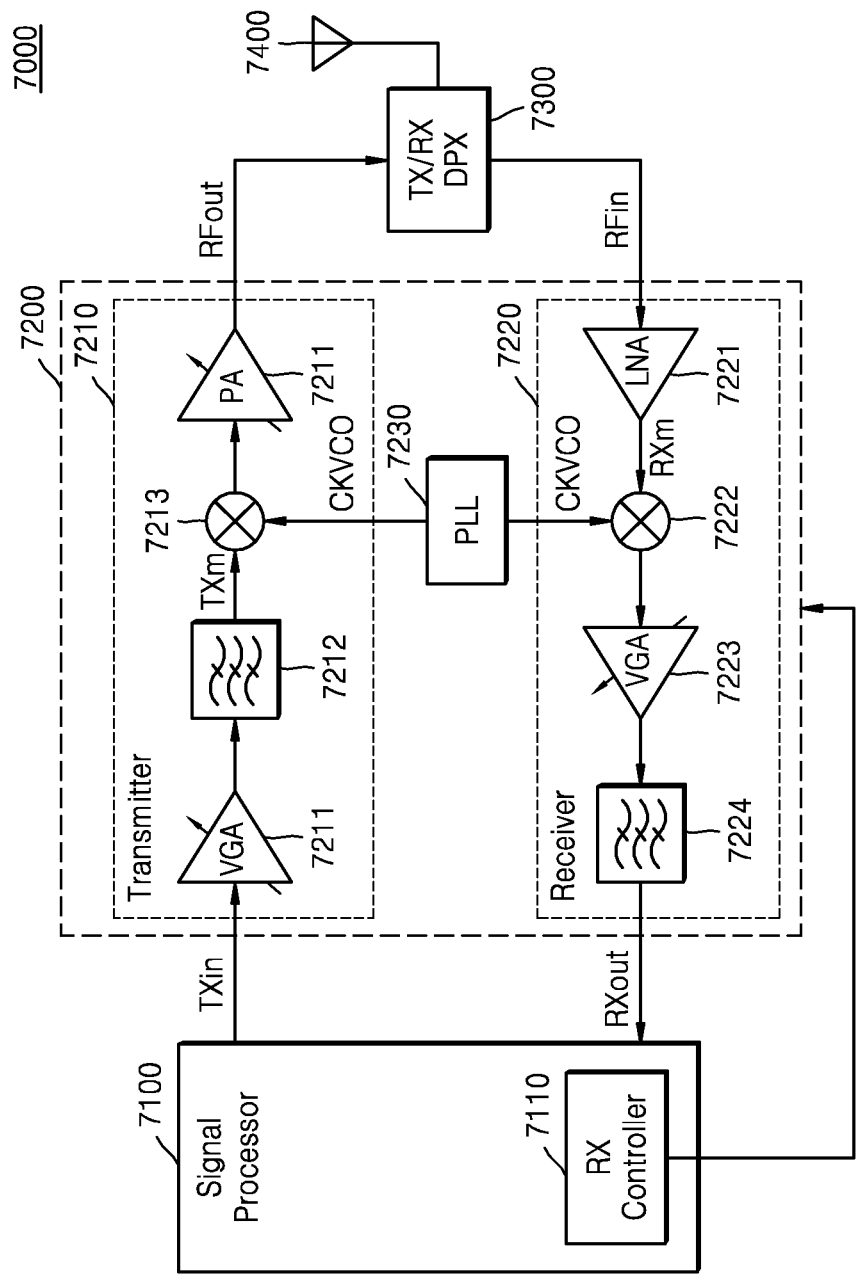
FIG. 12 is a block diagram illustrating a wireless communication device including a phase locked loop (PLL) according to an exemplary embodiment of the inventive concept.

FIG. 12 is a block diagram illustrating a wireless communication device 7000 including a PLL according to an exemplary embodiment of the inventive concept.

The wireless communication device 7000 may include an antenna 7400 and may communicate with another device by transmitting or receiving a signal through the antenna 7400.

The wireless communication system in which the wireless communication device 7000 communicates with another device may be a wireless communication system using a cellular network such as a $5^{th}$ generation (5G) wireless system, a long term evolution (LTE) system, an LTE-advanced system, a code division multiple access (CDMA) system, or a global system for mobile communications (GSM) system, a wireless local area network (WLAN) system, or another arbitrary wireless communication system.

As illustrated in FIG. 12, the wireless communication device 7000 includes a signal processor 7100, a transceiver 7200, a transmission and reception duplexer 7300, and the antenna 7400. The transmission and reception duplexer 7300 may provide a signal received through the antenna 7400 as a radio frequency (RF) input signal RFin to the transceiver 7200 and may provide an RF output signal RFout received from the transceiver 7200 to the antenna 7400.

The signal processor 7100 may process a baseband transmission and reception signal. The signal processor 7100 includes include a controller 7110 (e.g., a control circuit) that controls the transceiver 7200.

In an exemplary embodiment, the transceiver 7200 includes a transmitter 7210, a receiver 7220, and a PLL 7230. The transmitter 7210 may generate the RF output signal RFout by processing a transmission input signal TXin received from the signal processor 7100. As illustrated in FIG. 12, the transmitter 7210 may include a variable gain amplifier 7211, a TX filter 7212, a TX mixer 7213, and a power amplifier 7211.

The receiver 7220 may generate a reception output signal RXout and may provide the generated reception output signal RXout to the signal processor 7100 by processing the RF input signal RFin. In order to process the RF input signal RFin, the receiver 7220 may include a low noise amplifier 7221, an RX mixer 7222, a variable gain amplifier 7223, and an RX filter 7224.

The PLL 7230 may generate a local oscillation signal, that is, a clock signal that provides a frequency for sampling the transmission input signal TXin and the RF input signal RFin. An output clock signal CKVCO of the PLL 7230 may be provided to the TX mixer 7213 and the RX mixer 7222 of the receiver 7220. The transmitter 7210 may receive the transmission input signal TXin from the signal processor 7100, may perform frequency mixing on a signal TXm based on the transmission input signal TXin and the output clock signal CKVCO, and may output the RF output signal RFout through the antenna 7400. In addition, the receiver 7220 may receive the RF input signal RFin through the antenna 7400, may perform frequency mixing on a signal RFm based on the RF input signal RFin and the output clock signal CKVCO, and may output the reception output signal RXout to the signal processor 7100.

The phase locked circuit according to exemplary embodiments of the inventive concept described with reference to FIGS. 1 to 11 may be applied to the PLL 7230. Thus, the PLL 7230 may include a coarse phase detection circuit and a fine phase detection circuit. The phase difference between the input clock signal CKDTC and the feedback clock signal CKFB may be detected by the fine phase detection circuit. Based on the detection result, the amount of current output from the charge pump of the coarse phase detection circuit may be controlled. In accordance with the controlled amount of output current, the phase difference between the input clock signal CKDTC and the feedback clock signal CKFB may enter a locking range in which the fine phase detection circuit may perform the phase locking operation. Then, by performing the switching operation, the phase locking operation may be switched so that the PLL 7230 may perform the phase locking operation by the fine phase detection circuit from the phase locking operation performed by the coarse phase detection circuit.

The transmitter 7210 and the receiver 7220 in the transceiver 7200 may time divisionally process the transmission and reception signal in a time division duplexing mode. Frequencies of the transmission signal and the reception signal, that is, the RF output signal RFout and the RF input signal RFin may be different from each other. The PLL 7230 according to at least one exemplary embodiment of the inventive concept may stably perform the phase locking operation and may improve performance of the wireless communication device 7000 since the PLL 7230 may have a shorter locking time than a conventional PLL.

While the inventive concept has been particularly shown and described with reference to exemplary embodiments thereof, it will be understood that various changes in form and details may be made therein without departing from the spirit and scope of the inventive concept.

What is claimed is:

1. A phase locked circuit comprising:
an oscillator configured to generate an output clock signal;
a first phase detector configured to detect a phase difference between an input clock signal and a feedback clock signal based on the output clock signal;
a second phase detector having a wider phase locking range than that of the first phase detector and configured to detect the phase difference between the input clock signal and the feedback clock signal; and
a charge pump controller configured to control an output current of a charge pump included in the second phase detector based on the phase difference detected by the first phase detector,
wherein, when the phase difference between the input clock signal and the feedback clock signal is within the phase locking range of the first phase detector, the oscillator and the first phase detector are connected to each other.

2. The phase locked circuit of claim 1, wherein
the charge pump controller increases an amount of offset current output from the charge pump to a loop filter when a phase of the feedback clock signal is later than a target phase and increases an amount of offset current received by the charge pump from the loop filter when the phase of the feedback clock signal is earlier than the target phase.

3. The phase locked circuit of claim 2, wherein
the oscillator increases a frequency of the output clock signal based on the amount of the offset current output from the charge pump to the loop filter and reduces the frequency of the output clock signal based on the amount of the offset current received by the charge pump from the loop filter.

4. The phase locked circuit of claim 2, wherein
the charge pump further comprises an offset circuit,
wherein the charge pump controller determines an amount and direction of the offset current output from the offset circuit, and
wherein the output current is increased or reduced based on the offset current.

5. The phase locked circuit of claim 1, wherein
the first phase detector detects the phase difference based on a slope voltage having a prescribed slope generated by integrating the input clock signal in accordance with time and the feedback clock signal.

6. A phase locked circuit comprising:
an oscillator configured to generate an output clock signal;
a first phase difference detector configured to output a first voltage that indicates a phase difference between an input clock signal and a feedback clock signal;
a phase lock detector configured to detect whether a level of the first voltage is included in a previously set voltage level period to output a first detection signal;
a charge pump controller configured to output a charge pump control signal that controls an amount of output current of the charge pump based on the first detection signal; and
a second phase difference detector configured to output a second detection signal that indicates the phase difference between the input clock signal and the feedback clock signal;
wherein the charge pump is configured to output the output current based on the second detection signal and the charge pump control signal, and
wherein a frequency of the output clock signal is based on the amount of the output current, and the feedback clock signal is based on the output clock signal.

7. The phase locked circuit of claim 6, wherein
a maximum value or a minimum value of the charge pump control signal is generated based on a rising edge or falling edge of the first detection signal.

8. The phase locked circuit of claim 6, wherein
the first detection signal comprises an upper limit detection signal and a lower limit detection signal,
wherein the upper limit detection signal is a logic high when a level of the first voltage is lower than a voltage upper limit level, and
wherein the lower limit detection signal is a logic high when the level of the first voltage is higher than a voltage lower limit level.

9. The phase locked circuit of claim 8, wherein
the phase lock detector further comprises a first comparator and a second comparator,
wherein the first comparator compares the voltage upper limit level with the level of the first voltage to generate a first comparison result and outputs the upper limit detection signal in accordance with the first comparison result, and
wherein the second comparator compares the voltage lower limit level with the level of the first voltage to generate a second comparison result and outputs the lower limit detection signal in accordance with the second comparison result.

10. The phase locked circuit of claim 8, wherein
the amount of the output current is reduced or maintained when the upper limit detection signal indicates the logic high and is increased or maintained when the lower limit detection signal indicates a logic low.

11. The phase locked circuit of claim 8, wherein
the charge pump controller generates a first value obtained by multiplying a minus increment value by the upper limit detection signal, generates a second value obtained by multiplying a plus increment value by the lower limit detection signal, and outputs the charge pump control signal obtained by integrating the first value and the second value.

12. The phase locked circuit of claim 6, wherein
the charge pump further comprises an offset circuit including an offset current source and an offset switch,
wherein the offset switch determines a direction of an offset current output from the offset circuit, and
wherein the output current is increased or reduced based on the offset current.

13. The phase locked circuit of claim 12, wherein
the charge pump control signal further comprises an offset control signal and a phase control signal, and
wherein the offset control signal indicates the amount of the offset current and the phase control signal indicates an increase or reduction in the output current.

14. The phase locked circuit of claim 6, further comprising a digital time converter configured to receive a reference clock signal and delay the reference clock signal to output an input clock signal, wherein the first phase difference detector comprises a slope generator configured to integrate a rising edge or a falling edge of the input clock signal and to output a slope voltage having a prescribed slope, and wherein the first voltage has a value of the slope voltage sampled by the rising edge or falling edge of the feedback clock signal.

15. The phase locked circuit of claim 6, wherein when the first voltage is included in the previously set voltage level period, the oscillator is electrically connected to the first phase difference detector via a switch.

16. A method of operating a phase locked circuit, the method comprising:

detecting, by a first phase difference detector, a phase difference between an input clock signal and a feedback clock signal;

outputting a logic high upper limit detection signal when the phase difference indicates a phase of the feedback clock signal is later than a target phase and outputting a logic high lower limit detection signal when the phase difference indicates the phase of the feedback clock signal is earlier than the target phase;

controlling an output current of a charge pump connected to a second phase difference detector based on the lower limit detection signal and the upper limit detection signal; and controlling a frequency of an output clock signal based on the output current.

17. The method of claim 16, further comprising:

outputting a phase locking confirmation signal transited to a logic high in response to a logic high of the upper limit detection signal and the lower limit detection signal; and establishing an electrical connection between an oscillator outputting the output clock signal and the first phase difference detector when the phase locking confirmation signal is the logic high.

18. The method of claim 16, wherein the upper limit detection signal is transited to a logic high when the phase difference is greater than a first threshold value and the lower limit detection signal is transited to a logic high when the phase difference is greater than a second threshold value.

19. The method of claim 16, wherein the controlling of the output current of the charge pump connected to the second phase difference detector based on the lower limit detection signal and the upper limit detection signal further comprises:

increasing a frequency of the output clock signal based on the logic high upper limit detection signal; and reducing the frequency of the output clock signal based on the logic high lower limit detection signal.

20. The method of claim 16, wherein the controlling of the output current of the charge pump connected to the second phase difference detector based on the lower limit detection signal and the upper limit detection signal further comprises:

outputting a charge pump control signal that controls an output of an offset circuit based on the upper limit detection signal and the lower limit detection signal; and increasing or reducing the output current based on the output of the offset circuit.

* * * * *